US012713920B2

(12) United States Patent
Bohnenberger et al.

(10) Patent No.: US 12,713,920 B2
(45) Date of Patent: Aug. 18, 2026

(54) POWER SEMICONDUCTOR MODULE ARRANGEMENT COMPRISING HEAT-CONDUCTING LAYER AND HEAT SINK AND METHOD FOR PRODUCING THE SAME

(71) Applicant: Infineon Technologies Austria AG, Villach (AT)

(72) Inventors: Timo Bohnenberger, Neutraubling (DE); Alexander Roth, Zeitlarn (DE); Alexander Heinrich, Bad Abbach (DE)

(73) Assignee: Infineon Technologies Austria AG, Villach (AT)

( * ) Notice: Subject to any disclaimer, the term of this patent is extended or adjusted under 35 U.S.C. 154(b) by 473 days.

(21) Appl. No.: 18/316,376

(22) Filed: May 12, 2023

(65) Prior Publication Data

US 2023/0369166 A1 Nov. 16, 2023

(30) Foreign Application Priority Data

May 16, 2022 (EP) .................................... 22173452

(51) Int. Cl.
*H10W 40/73* (2026.01)
*H10W 40/00* (2026.01)
*H10W 90/00* (2026.01)

(52) U.S. Cl.
CPC ....... *H10W 40/735* (2026.01); *H10W 40/037* (2026.01); *H10W 90/00* (2026.01)

(58) Field of Classification Search
CPC ....... H01L 25/072; H01L 25/18; H01L 21/50; H01L 21/4882; H01L 23/36; H01L 23/367; H01L 23/3736; H10W 40/10; H10W 40/255; H10W 40/735; H10W 90/00; H10W 40/037
USPC .......................................................... 257/712
See application file for complete search history.

(56) References Cited

U.S. PATENT DOCUMENTS 9,412,679 B1 * 8/2016 Nakahara .............. H10W 76/47
2006/0263235 A1 * 11/2006 Morozumi ............. C22C 13/02 420/562
2014/0042212 A1 * 2/2014 Shearer .................. B23K 1/203 228/248.1
2015/0255367 A1 * 9/2015 Nakahara ............ H10W 40/255 438/122

(Continued)

FOREIGN PATENT DOCUMENTS

WO 2013145471 A1 10/2013

*Primary Examiner* — Didarul A Mazumder
(74) *Attorney, Agent, or Firm* — Murphy, Bilak & Homiller, PLLC

(57) ABSTRACT

A power semiconductor module arrangement includes a power semiconductor module, wherein the power semiconductor module includes a substrate for carrying at least one semiconductor body, and a heat-conducting layer arranged on a lower surface of the power semiconductor module, wherein the lower surface of the power semiconductor module is a surface that is configured to be mounted to a heat sink, and wherein the heat-conducting layer consists of a metallic and non-eutectic material that is solid at temperatures below a first threshold temperature, that is viscous at temperatures above the first threshold temperature and below a second threshold temperature, and that is fluid at temperatures above the second threshold temperature.

12 Claims, 2 Drawing Sheets

(56) References Cited

U.S. PATENT DOCUMENTS

2020/0083138 A1* 3/2020 Hohlfeld ............ H01L 21/4882
2020/0098662 A1* 3/2020 Bayerer ............. H10W 40/255

* cited by examiner

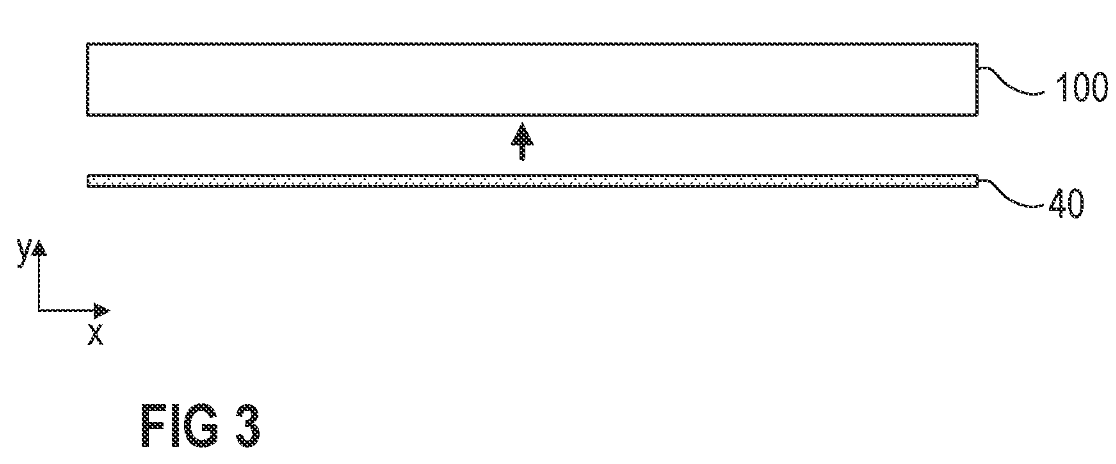
FIG 3
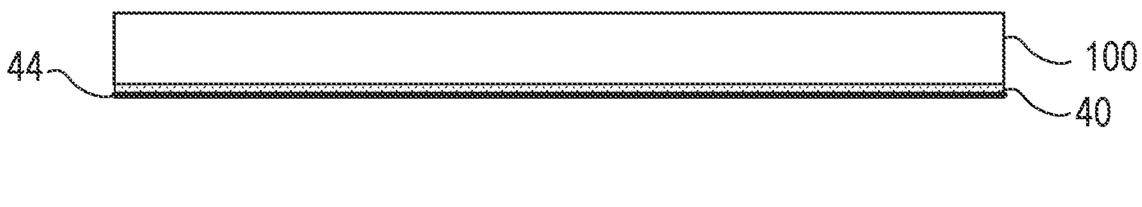
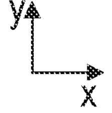
FIG 4
100
40
30
y
x
FIG 5

POWER SEMICONDUCTOR MODULE ARRANGEMENT COMPRISING HEAT-CONDUCTING LAYER AND HEAT SINK AND METHOD FOR PRODUCING THE SAME

TECHNICAL FIELD

The instant disclosure relates to a power semiconductor module arrangement and a method for producing the same, in particular to a power semiconductor module arrangement comprising a thermal interface material.

BACKGROUND

Power semiconductor modules usually include at least one substrate. The substrate may be arranged on a base plate. A semiconductor arrangement including a plurality of semiconductor components (e.g., two diodes, MOSFETs, JFETs, HEMTs, IGBTs, or any other suitable controllable semiconductor elements in a parallel, half-bridge, or any other configuration) is usually arranged on at least one of the at least one substrates. Each substrate usually comprises a substrate layer (e.g., a ceramic layer), a first metallization layer deposited on a first side of the substrate layer and a second metallization layer deposited on a second side of the substrate layer. The controllable semiconductor components are mounted, for example, on the first metallization layer. The first metallization layer may be a structured layer while the second metallization layer is usually a continuous layer. The second metallization layer may be attached to a base plate.

Heat that is generated by the controllable semiconductor components is dissipated through the substrate and further through an (optional) base plate to a heat sink. A heat-conducting layer is usually arranged between the substrate and the heat sink (in base plate-less modules) or between a base plate and the heat sink (in modules comprising a base plate) to effectively conduct the heat away from the substrate. The heat-conducting layer is required to have adequate heat conducting properties (e.g., high thermal conductivity). At the same time, the heat-conducting layer is required to permanently mount the power semiconductor module to the heat sink (e.g., to form a firm substance-to-substance bond between the power semiconductor module and the heat sink).

There is a need for an improved power semiconductor module which provides for an improved thermal conductivity between the power semiconductor module and a heat sink, and for a method for producing the same.

SUMMARY

A power semiconductor module arrangement includes a power semiconductor module, wherein the power semiconductor module includes a substrate for carrying at least one semiconductor body, and a heat-conducting layer arranged on a lower surface of the power semiconductor module, wherein the lower surface of the power semiconductor module is a surface that is configured to be mounted to a heat sink, and wherein the heat-conducting layer consists of a metallic and non-eutectic material that is solid at temperatures below a first threshold temperature, that is viscous at temperatures above the first threshold temperature and below a second threshold temperature, and that is fluid at temperatures above the second threshold temperature.

A method for producing a power semiconductor module arrangement includes forming a heat-conducting layer on a lower surface of a power semiconductor module, wherein the power semiconductor module comprises a substrate for carrying at least one semiconductor body, the lower surface of the power semiconductor module is a surface that is configured to be mounted to a heat sink, and the heat-conducting layer consists of a metallic and non-eutectic material that is solid at temperatures below a first threshold temperature, that is viscous at temperatures above the first threshold temperature and below a second threshold temperature, and that is fluid at temperatures above the second threshold temperature.

The invention may be better understood with reference to the following drawings and the description. The components in the figures are not necessarily to scale, emphasis is instead being placed upon illustrating the principles of the invention. Moreover, in the figures, like reference numerals designate corresponding parts throughout the different views.

BRIEF DESCRIPTION OF THE DRAWINGS

FIG. 3 schematically illustrates a method step of forming a thermal interface layer on a power semiconductor module.

FIG. 4 schematically illustrates an exemplary semiconductor module with a thermal interface layer and a protective foil.

FIG. 5 schematically illustrates a method step of arranging a power semiconductor module with a thermal interface layer formed thereon on a heat sink.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as “first element”, “second element”, “third element” etc. are not to be understood as enumerative. Instead, such designations serve solely to address different “elements”. That is, e.g., the existence of a “third element” does not require the existence of a “first element” and a “second element”. A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
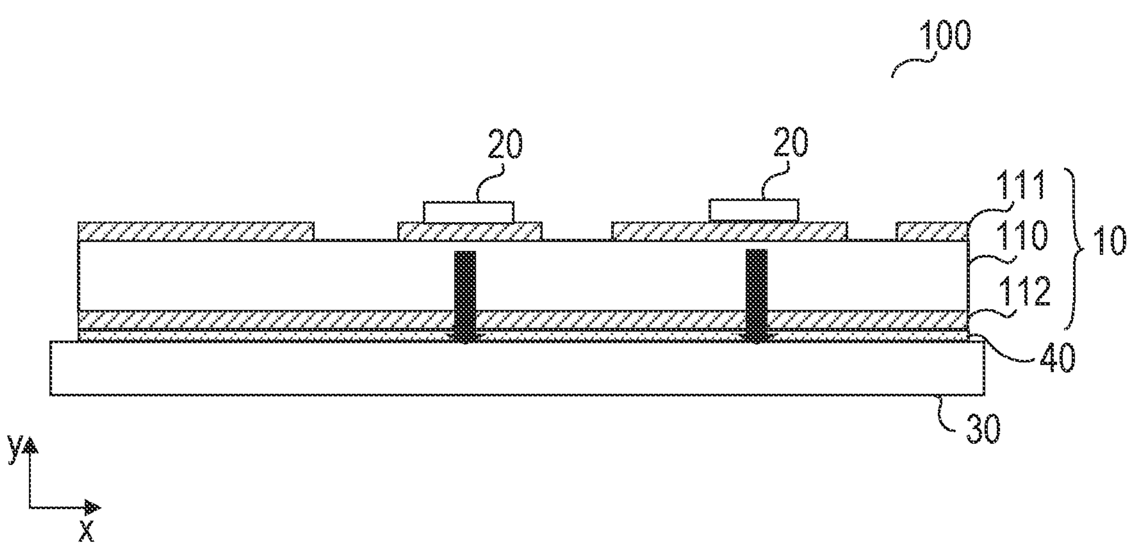
FIG. 1 schematically illustrates a cross-sectional view of a power semiconductor module according to one example.

FIG. 1 exemplarily illustrates a power semiconductor module 100 comprising a substrate 10. The substrate 10 includes a dielectric insulation layer 110, a (structured) first metallization layer 111 attached to the dielectric insulation layer 110, and a second metallization layer 112 attached to the dielectric insulation layer 110. The dielectric insulation layer 110 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. Optionally, the first and/or second metallization layer 111, 112 may be covered by a thin layer of nickel or silver, for example. Such a layer may be formed using a nickel plating process or a silver plating process, for example. The substrate 10 may be a ceramic substrate, that is, a substrate in which the dielectric insulation layer 110 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 110 may consist of or include one of the following materials: $Al_2O_3$, AlN, or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate.

Usually one or more semiconductor bodies 20 are arranged on a substrate 10. Each of the semiconductor bodies 20 arranged on a substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable controllable semiconductor element. One or more semiconductor bodies 20 may form a semiconductor arrangement on the substrate 10. In FIG. 1, two semiconductor bodies 20 are exemplarily illustrated. Any other number of semiconductor bodies 20, however, is also possible.

In the example illustrated in FIG. 1, the power semiconductor module 100 only comprises the substrate 10 with the semiconductor bodies 20 mounted thereon. Usually, the power semiconductor module 100 further comprises additional components such as, e.g., electrical connections and a housing or an encapsulant. Such additional components, however, are of no specific relevance for the present invention and, therefore, are omitted in the figures for the sake of clarity. The power semiconductor module 100 (the substrate 10 with the semiconductor bodies 20 mounted thereon in the example of FIG. 1) is attached to a heat sink 30 with the second metallization layer 112 of the substrate 10 arranged between the dielectric insulation layer 110 and the heat sink 30. A heat-conducting layer 40 (thermal interface material TIM) is arranged between the second metallization layer 112 and the heat sink 30 and is configured to form a firm substance-to-substance bond between the substrate 10 and the heat sink 30. Heat that is generated by the semiconductor bodies 20 may be dissipated through the substrate 10 and the heat-conducting layer 40 to the heat sink 30. This is exemplarily illustrated by the bold arrows in FIG. 1.

The second metallization layer 112 of the semiconductor substrate 10 in FIG. 1 is a continuous layer. The first metallization layer 111 is a structured layer in the arrangement illustrated in FIG. 1. "Structured layer" in this context means that the first metallization layer 111 is not a continuous layer, but includes recesses between different sections of the layer. Such recesses are schematically illustrated in FIG. 1. The first metallization layer 111 in this arrangement exemplarily includes four different sections. Different semiconductor bodies 20 may be mounted to the same or to different sections of the first metallization layer 111. Different sections of the first metallization layer 111 may have no electrical connection or may be electrically connected to one or more other sections using electrical connections such as, e.g., bonding wires/ribbons. Electrical connections may also include connection plates or conductor rails, for example, to name just a few examples. The first metallization layer 111 being a structured layer, however, is only an example. It is also possible that the first metallization layer 111 is a continuous layer. According to another example, the substrate 10 may only comprise a dielectric insulation layer 110 and a first metallization layer 111. The second metallization layer 112 may be omitted. In this case, the heat-conducting layer 40 may be arranged between the dielectric insulation layer 110 and the heat sink 30, for example.

In the example illustrated in FIG. 1, the substrate 10 itself forms a bottom of the power semiconductor module 100. The substrate 10 may be arranged in a housing or may be molded in a casing (not specifically illustrated in FIG. 1) and may form a bottom of the housing or casing, for example. That is, a lower surface of the power semiconductor module 100 that is in direct contact with the heat-conducting layer 40 may be provided by the substrate 10 itself.

Figure 2:
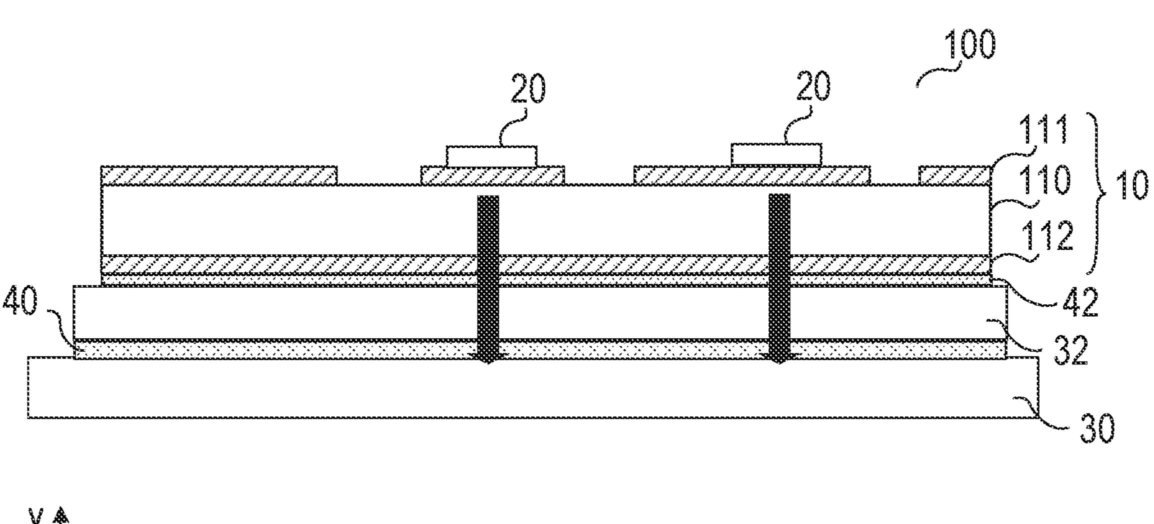
FIG. 2 schematically illustrates a cross-sectional view of a power semiconductor module according to another example.
Figure 2:
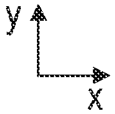

According to another example, the substrate 10 is arranged on an additional base plate 32. This is schematically illustrated in FIG. 2. In an arrangement comprising a base plate 32, the base plate 32 may form a bottom of a housing or casing. The substrate 10 may be arranged within a cavity formed by the housing, for example, or may be enclosed by a casing. In some examples, only one substrate 10 is arranged on a base plate 32. In other examples, more than one substrate 10 may be arranged on a single base plate 32. In an arrangement comprising a base plate 32, the lower surface of the power semiconductor module 100 may be provided by the base plate 32, and the heat-conducting layer 40 (thermal interface material TIM) may be arranged between the base plate 32 and the heat sink 30 and may be configured to form a firm substance-to-substance bond between the base plate 32 and the heat sink 30. Heat that is generated by the semiconductor bodies 20 may be dissipated through the substrate 10, the base plate 32, and the heat-conducting layer 40 to the heat sink 30. This is exemplarily illustrated by the bold arrows in FIG. 2.

According to an even further example which is not specifically illustrated, the power semiconductor module 100 comprises a housing, the housing comprising sidewalls, a lid and a bottom or ground plate. One or more substrates 10 may be arranged in the housing (i.e., on the ground plate). Optionally, the one or more substrates 10 may be arranged on a base plate 32, the base plate 32 also being arranged inside the housing (i.e., on the ground plate of the housing). The lower surface of the power semiconductor module 100 in this case may be provided by the ground plate of the housing. The lower surface of the power semiconductor module 100, however, may also be provided by any other component of the power semiconductor module 100.

An additional heat-conducting layer 42 consisting of the same material as the heat-conducting layer 40 may be arranged between the substrate 10 and the base plate 32, for example. This additional heat-conducting layer 42, however, is optional. The substrate 10 may be mounted to a base plate 32 by means of any other suitable kind of connection layer (e.g., by means of a conventional solder or sinter layer).

The base plate 32 may comprise a metal, for example. According to one example, the base plate 32 comprises at least one of Al and Cu. According to another example, the base plate 32 may be a metal matrix composite (MMC) base plate comprising an MMC material such as AlSiC. Any other suitable materials are possible. The base plate 32, optionally, may also be covered by a thin layer of nickel or silver, for example Such a layer may be formed using a nickel plating process or a silver plating process, for example.

The heat-conducting layer 40 is a metallic layer. That is, at least one material comprised in the heat-conducting layer 40 is a metal. According to one example, the heat-conducting layer 40 further is a non-corrosive and non-toxic layer. The heat-conducting layer 40 is non-eutectic. That is, the heat-conducting layer 40 is solid at temperatures below a first threshold temperature. In a temperature range above the first threshold temperature and below a second threshold temperature, which is higher than the first threshold temperature, the heat-conducting layer 40 is viscous. That is, in a temperature range between the first threshold temperature and the second threshold temperature, the heat-conducting layer 40 has a semi-liquid or waxlike consistency. The heat-conducting layer 40 becomes fluid at temperatures above the second threshold temperature. The first threshold temperature may be between 80° C. and 125° C., and the second threshold temperature may be between 140° C. and 180° C., for example.

The temperature range defined by the first threshold temperature and the second threshold temperature may essentially correspond to the temperature range that may occur during operation of the power semiconductor module 100. That is, the heat-conducting layer 40 is viscous when the power semiconductor module 100 is operated. In this way, the material of the heat-conducting layer 40 may reliably fill any gaps or an unevenness of the directly adjoining surfaces. That is, the heat-conducting layer 40 acts as a gap filler with ideal inter-metallic phonon-coupling between the lower surface of the power semiconductor module 100 and the heat sink 30. The heat-conducting layer 40 as described herein, therefore, reduces or even dissolves any thermal bottlenecks of conventional power semiconductor modules 100. According to one example, the heat-conducting layer 40 has a viscous consistence at temperatures of between 81° C. (first threshold temperature) and 160° C. (second threshold temperature). This temperature range in many cases essentially corresponds to the temperature range that may occur during operation of the power semiconductor module 100.

One example of a heat-conducting layer 40 consisting of a metallic and non-eutectic material that is solid at temperatures below a first threshold temperature, that is viscous at temperatures above the first threshold temperature and below a second threshold temperature, and that is fluid at temperatures above the second threshold temperature is a heat-conducting layer 40 that comprises tin. For example, the heat-conducting layer 40 may comprise between 50 and 55 weight % of tin. A layer comprising between 50 and 55 weight % of tin is solid at temperatures below 81° C., is viscous at temperatures between 81° C. and 160° C., and is fluid at temperatures above 160° C. That is, a heat-conducting layer 40 comprising between 50 and 55 weight % of tin is viscous over the entire operating range of the power semiconductor module 100. In addition to tin, the heat-conducting layer 40 may consist of indium and bismuth, for example, wherein a weight ratio between indium and bismuth in the heat-conducting layer 40 may be 3:2. When, for example, the heat-conducting layer comprises 50 weight % of tin, it may further comprise 30 weight % of indium and 20 weight % of bismuth. Such an In—Bi—Sn layer 40 consisting of the three materials in the amounts mentioned above fulfills all requirements of a heat-conducting layer 40 according to the present application. Other materials (metal alloys), however, may also be possible which also fulfill all the requirements as stated herein. Other potential alloys may include, for example:

| Element 1 | Element 2 | Element 3 | Element 4 | Liquidus | Solidus |
|---|---|---|---|---|---|
| 38.0 Pb | 37.0 Bi | 25.0 Sn | | 127 | 93 |
| 51.6 Bi | 37.4 Sn | 6.0 In | 5.0 Pb | 129 | 95 |
| 36.0 Bi | 32.0 Pb | 31.0 Sn | 1.0 Ag | 136 | 95 |
| 36.7 Bi | 31.8 Pb | 31.5 Sn | | 136 | 95 |
| 36.4 Bi | 31.8 Pb | 31.8 Sn | | 137 | 95 |
| 34.0 Pb | 34.0 Sn | 32.0 Bi | | 133 | 96 |
| 38.4 Bi | 30.8 Pb | 30.8 Sn | | 135 | 96 |
| 43.0 Pb | 28.5 Bi | 28.5 Sn | | 137 | 96 |
| 38.4 Pb | 30.8 Bi | 30.8 Sn | | 139 | 96 |
| 33.4 Bi | 33.3 Pb | 33.3 Sn | | 143 | 96 |
| 60.0 Sn | 25.5 Bi | 14.5 Pb | | 180 | 96 |
| 48.0 Bi | 28.5 Pb | 14.5 Sn | 9.0 Sb | 227 | 103 |

As can be seen from the table given above, the heat-conducting layer 40 may consist of an alloy comprising more than 10 weight % tin and less than 90 weight % of additional metals selected from the group of indium, bismuth, antimony, silver, and lead. According to one example, the heat-conducting layer 40 is free of (does not contain) gallium or any organic components.

The material of the heat-conducting layer 40 being solid at temperatures below the first threshold temperature (e.g., at room temperature) allows to easily handle the power semiconductor module 100 with the heat-conducting layer 40 attached thereto, e.g., during shipping. The first threshold temperature and the second threshold temperature are generally defined by the specific composition of the heat-conducting layer 40. Different compositions may become viscous (first threshold temperature) and finally liquid (second threshold temperature) at different temperatures, depending on the materials and their specific quantities in the heat-conducting layer 40. That is, a suitable composition may be chosen for an application having a specific temperature range during operation of the power semiconductor module 100 such that the first and second threshold temperatures essentially correspond to the borders of the temperature range occurring during operation. The final heat-conducting layer 40 may undergo at least one phase change from solid to viscous or solid to liquid when heating up from room temperature to an operating temperature of the power semiconductor module 100.

The heat-conducting layer 40 may be formed on or attached to the lower surface of the power semiconductor module 100 by means of different alternative processes. FIG. 3 very generally illustrates a method step of forming a heat-conducting layer 40 on or applying/attaching a heat-conducting layer 40 to a lower surface of a power semiconductor module 100. The heat-conducting layer 40 may have a thickness of 50 μm to 200 μm, or 50 μm to 500 μm in a vertical direction y, for example, wherein the vertical direction y is a direction that is perpendicular to the lower surface of the power semiconductor module 100.

According to one example, the power semiconductor module 100 may be completely assembled before the heat-conducting layer 40 is formed thereon/attached thereto. That is, all steps that are performed during the assembly of the power semiconductor module 100 which may require applying heat to the power semiconductor module 100 may be performed while the heat-conducting layer 40 has not yet been formed thereon/attached thereto. As has been described above, the power semiconductor module 100 may be a power semiconductor module comprising a base plate 32, or may be a base plate-less power semiconductor module.

According to one example, the heat-conducting layer 40 may be produced separately as a foil or plate. Such a foil or plate may be easily handled at temperatures below the first threshold temperature (e.g., at room temperature). The pre-produced foil or plate may be applied to the lower surface of the power semiconductor module 100. For example, the foil or plate may be glued, tacked, hot rolled, or laminated on the lower surface of the power semiconductor module 100. According to one example, temperature may be applied to the heat-conducting layer 40 during the process of attaching it to the lower surface of the power semiconductor module 100. For example, the temperature applied may just be high enough for the heat-conducting layer 40 to become slightly viscous. In this way, the heat-conducting layer 40 remains in its desired shape and can still be easily handled. Further, the viscous heat-conducting layer 40 adheres to the lower surface of the power semiconductor module 100. When the temperature is reduced again to temperatures of below the first threshold temperature, the heat-conducting layer 40 becomes solid again and permanently attaches to the lower surface of the power semiconductor module 100. Optionally, a certain amount of pressure may also be applied when attaching the heat-conducting layer 40 (i.e., the pre-produced foil or plate) to the lower surface of the power semiconductor module 100.

According to another example, it is alternatively possible to form the heat-conducting layer 40 directly on the lower surface of the power semiconductor module 100, e.g., by applying the material of the heat-conducting layer 40 in its solid solution state by means of a pattern-dispensing process or by means of stencil printing. Other suitable processes can also be used to form the heat-conducting layer 40. The material may be applied on the lower surface of the power semiconductor module 100 as a continuous layer or as a pattern of a plurality of different subsections. According to one example, a plurality of separate spots arranged in a desired pattern may be formed on the lower surface of the power semiconductor module 100. That is, the heat-conducting layer 40 may either be a continuous layer or a structured layer.

The attachment process can take place at elevated temperatures close to or above the first threshold temperature, utilizing the increased workability of the heat conducting layer 40 at these temperatures. Alternatively, the attachment process can also be followed by a heat treatment for bonding. It may be advantageous to use an oxygen-free or reducing atmosphere to prevent surface oxidations of the heat conduction layer. Commonly used conditions are nitrogen, vacuum, forming gas ($N_2/H_2$), or formic acid.

According to one example, the step of forming the heat-conducting layer 40 is conducted at a temperature of above 0.9 of the homologous temperature of the heat-conducting layer equivalent to the first threshold temperature.

Optionally, the final heat-conducting layer 40 may be protected by a protecting foil 44 after applying the heat-conducting layer 40 to/forming the heat-conducting layer 40 on the power semiconductor module 100. In this way, the heat-conducting layer 40 is well protected during shipping of the power semiconductor module 100 and before mounting the power semiconductor module 100 to a heat sink 30. A protective foil 44 may protect the heat-conducting layer 40 from any kind of environmental influences such as, e.g., dust, foreign particles, or oxygen. A heat-conducting layer 40 attached to a power semiconductor module 100 that is protected by a protective foil 44 is schematically illustrated in FIG. 4.

If a protective foil 44 is applied to the heat-conducting layer 40, this protective foil 44 may be removed again before mounting the power semiconductor module 100 to a heat sink 30. The power semiconductor module 100 may be mounted to the heat sink 30 with the heat-conducting layer 40 arranged between the power semiconductor module 100 and the heat sink 30. The power semiconductor module 100 may be pressed onto the heat sink 30. According to one example, heat may be applied during the step of mounting the power semiconductor module 100 to the heat sink 30. In this way, the heat-conducting layer 40 may become viscous. When the arrangement is subsequently cooled down again, the heat-conducting layer 40 attaches the power semiconductor module 40 to the heat sink 30. The step of mounting the power semiconductor module 40 to the heat sink 30 is exemplarily illustrated in FIG. 5.

During subsequent operation of the power semiconductor module 100, heat may be generated (e.g., by the semiconductor bodies 20) which is conducted away through the heat-conducting layer 40 to the heat sink 30. The heat-conducting layer 40 is heated to temperatures of between the first threshold temperature and the second threshold temperature (typical operating temperatures). The heat-conducting layer 40, therefore, becomes viscous during operation of the power semiconductor module 100. In its viscous state, the heat-conducting layer 40 still forms a firm substance-to-substance bond between the power semiconductor module 40 and the heat sink 30. The material of the heat-conducting layer 40, however, does not leak out from under the power semiconductor module 100 and remains essentially in its desired shape.

The lower surface of the power semiconductor module 100 may be prepared before applying the heat-conducting layer 40. The surface of the heat sink 30 to which the power semiconductor module 100 is mounted may be prepared in a similar way. In particular, every surface that comes into direct contact with the heat-conducting layer 40 may be prepared correspondingly. A main aspect of surface preparation may be to ensure the wettability of the concerned surfaces. A thin oxide layer may form on a metal surface when it comes into contact with oxygen. For a sufficient wettability of a metal surface, for example, such an oxide layer may be removed before forming the heat-conducting layer 40 thereon. The oxide layer may be removed by means of a plasma reduction process, for example. Alternatively, it is also possible, for example, to plate the respective surface with a thin layer of a noble metal, or to use a preform (e.g., a pre-produced foil or plate) that is coated with a flux layer. This flux layer may comprise or consist of a reducing agent, for example, which activates the respective metallic surface when it comes into contact with the metallic surface. "Activating" in this context means that an oxide layer that has formed on the surface is reduced to pure metal. According to another example, the respective surface may be plated with a diffusion layer consisting of Ni (nickel), Ni—Ti (nickel-titanium), or any other suitable metal.

The invention claimed is:

1. A power semiconductor module arrangement comprising a power semiconductor module, wherein the power semiconductor module comprises:

a substrate for carrying at least one semiconductor body; and a heat-conducting layer arranged on a lower surface of the power semiconductor module, wherein the lower surface of the power semiconductor module is a surface that is configured to be mounted to a heat sink, wherein the heat-conducting layer consists of a metallic and non-eutectic material that is solid at temperatures below a first threshold temperature, that is viscous at temperatures above the first threshold temperature and below a second threshold temperature, and that is fluid at temperatures above the second threshold temperature.

2. The power semiconductor module arrangement of claim 1, wherein the substrate comprises a dielectric insulation layer and a first metallization layer attached to the dielectric insulation layer, the first metallization layer configured to carry the at least one semiconductor body.

3. The power semiconductor module arrangement of claim 1, wherein the lower surface of the power semiconductor module is formed by a surface of the substrate.

4. The power semiconductor module arrangement of claim 1, wherein the power semiconductor module further comprises a base plate, wherein the substrate is arranged on a first surface of the base plate and the lower surface of the power semiconductor module is formed by a second surface of the base plate opposite the first surface.

5. The power semiconductor module arrangement of claim 1, further comprising a heat sink, wherein the heat-conducting layer is arranged between the power semiconductor module and the heat sink, and permanently attaches the heat sink to the power semiconductor module.

6. The power semiconductor module arrangement of claim 1, wherein the first threshold temperature is between 80° C. and 125° C.

7. The power semiconductor module arrangement of claim 1, wherein the second threshold temperature is between 140° C. and 180° C.

8. The power semiconductor module arrangement of claim 1, wherein the heat-conducting layer consists of a metal alloy.

9. The power semiconductor module arrangement of claim 1, wherein the heat-conducting layer undergoes at least one phase change from solid to viscous or solid to liquid when heating up from room temperature to an operating temperature of the power semiconductor module.

10. The power semiconductor module arrangement of claim 9, wherein the heat-conducting layer comprises tin.

11. The power semiconductor module arrangement of claim 10, wherein the heat-conducting layer comprises between 50 and 55 weight % of tin.

12. The power semiconductor module arrangement of claim 7, wherein the heat-conducting layer consists of an alloy comprising more than 10 weight % tin and less than 90 weight % of additional metals selected from the group of indium, bismuth, antimony, silver, and lead.

* * * * *